United States Patent [19]
Matsui et al.

[11] Patent Number: 4,797,616
[45] Date of Patent: Jan. 10, 1989

[54] HIGH SPEED NMR SPECTROSCOPIC IMAGING METHOD

[75] Inventors: Shigeru Matsui, El Cerrito, Calif.; Takashi Onodera, Koganei, Japan; Kensuke Sekihara, Hachioji, Japan; Hidemi Shiono, Akigawa, Japan; Hideki Kohno, Tokyo, Japan

[73] Assignee: Hitachi, Ltd., Tokyo, Japan

[21] Appl. No.: 151,901

[22] Filed: Feb. 3, 1988

[30] Foreign Application Priority Data

Feb. 4, 1987 [JP] Japan .................... 62-22310

[51] Int. Cl.$^4$ ............................ G01R 33/20
[52] U.S. Cl. ...................... 324/309; 324/307
[58] Field of Search ............ 324/300, 307, 309, 312; 128/653

[56] References Cited

U.S. PATENT DOCUMENTS

| 4,307,343 | 12/1981 | Likes | 324/307 |
| 4,319,190 | 3/1982 | Brown | 324/309 |
| 4,564,017 | 1/1986 | Glover | 324/307 |
| 4,567,893 | 2/1986 | Charles et al. | 128/653 |
| 4,678,996 | 7/1987 | Haacke et al. | 324/312 |
| 4,720,678 | 1/1988 | Glover et al. | 324/309 |
| 4,740,748 | 4/1988 | Rzedzian | 324/309 |
| 4,748,410 | 5/1988 | Macouski | 324/307 |

OTHER PUBLICATIONS

S. Matsui, "High-Speed Spatially Resolved High--Resolution NMR Spectroscopy", J. Am Chem, 1985, 107, 2817–2818.

M. Tropper, "Image Reconstruction for the NMR Echo-Planar Technique and for a Proposed Adaption to Allow Continuous Data Acquisition", Journal of Magnetic Resonance, 42, 193–202, 1981.

S. Lunggren, "A Simple Graphical Representation of Fourier-Based Imaging Methods", Journal of Magnetic Resonance, 54, 338–343, (1983).

P. C. Lauterbur, "Image Formation by Induced Local Interactions; Examples Employing Nuclear Magnetic Resonance", Nature, vol. 242, Mar. 16, 1973.

Primary Examiner—Michael J. Tokar
Attorney, Agent, or Firm—Antonelli, Terry & Wands

[57] ABSTRACT

An NMR spectroscopic imaging method of obtaining separate spin distribution images for respective spectral components of the spectrum of an NMR signal caused by the chemical shift of nuclides of interest in an object includes providing for a transversal magnetization signal of the object placed in a static magnetic field. A position of the signal in a phase domain is translated in a K-space from the origin thereof. Further, the signal is sampled while rotating a position of the signal in the K-space plural times on a certain circle in the K-space by applying a rotating field gradient, thereby to obtain a group of signal data. Signal data trains each of which is composed of signal data present at the same position on the K-space in the signal data group obtained by the sampling during the plural signal rotations, is subjected to Fourier transformations, respectively, thereby effecting a spectral analysis of the NMR signal.

8 Claims, 5 Drawing Sheets

HIGH SPEED NMR SPECTROSCOPIC IMAGING METHOD

BACKGROUND OF THE INVENTION

The present invention relates to an imaging method utilizing an NMR (nuclear magnetic resonance) phenomenon, and more particularly to an NMR measuring method suitable for performing a high speed spectroscopic imaging by use of a rotating field gradient.

An NMR spectroscopic imaging, which is also called a spatially resolved NMR spectroscopy, includes determining the magnetization distribution of a certain region of an object of interest as well as the spectrum of nuclear spins at each location in the magnetization distribution image. This spin spectrum represents a chemical shift with a magnetic resonant frequency which is mainly caused by the chemical coupling state of a nuclide of interest in the object exhibiting a magnetization. Therefore, the utility of the NMR spectroscopic imaging is expected in that a plurality of distinct spin distribution images for nuclides of interest can be obtained depending on the difference in the chemical coupling states of the nuclides. One of methods of performing such an NMR spectroscopic imaging at a high speed equivalent to a usual MR imaging is disclosed in Journal of American Chemical Society, 107, 2817 (1985) by some of the present inventors. In the disclosed method, it is necessary to continuously inverting a field gradient during the signal measurement. However, the realization of an ideal inversion of the field gradient is practically impossible, especially in a large size of NMR imaging apparatus. Accordingly, in the large size of NMR imaging apparatus, it is necessary to employ a trapezoidal field gradient inversion sequence instead of the rectangular field gradient inversion sequence. A cosine-like field gradient inversion sequence may also be employed. In this case, however, it is necessary to separately measure the waveform of the field gradient and to perform a special signal processing based on the measured waveform data (See Journal of Magnetic Resonance, 42, 193 (1981)).

SUMMARY OF THE INVENTION

An object of the present invention is to provide a novel high speed spectroscopic imaging method in which the problem of the high speed inversion of the field gradient is relieved.

Another object of the present invention is to provide a high speed spectroscopic imaging method which is applicable to an NMR imaging apparatus of a large size and with an intensive magnetic field and is capable of easily realizing a high resolution.

According to one aspect of the present invention, there is provided a high speed spectroscopic imaging method comprising a first step of providing for or preparing a transversal magnetization signal of an object placed in a homogeneous static magnetic field, a second step of applying a field gradient in a specified direction in a specified plane of the object to translate a position of the signal in a phase domain from the origin of a K-space, a third step of sampling the signal while rotating a position of the signal in the K-space plural times on a given circle with the center thereof at the origin of the K-space by applying a field gradient with its direction continuously rotating in the specified plane of the object, thereby to obtain a series of data groups, and a fourth step of performing respective Fourier transformations for plural data trains each of which is composed of data present at or corresponding to the same position on the K-space in the series of data groups obtained at the third step.

A progression or change of the signal in each of the above-mentioned plural data trains is caused by a chemical shift or a slight shift of the frequency of a spin signal due to the inhomogeneity of the static magnetic field. Accordingly, a spectral analysis of spins of nuclides of interest in the object is effected in the above-mentioned fourth step. Further, if the abovementioned first to third steps are repeated while changing the strength or magnitude of the field gradient, a plurality of groups of signal data rotating on circles having different radii on the K-space are successively obtained. By carrying out the spectral analysis at the fourth step for each of such data groups, selecting data of a spectral component of interest (for example, the spectrum of the nuclide of hydrogen in H$_2$O molecules) and subjecting the selected data to a Fourier transformation in each radius direction of the K-space, there can be obtained information which is identical to data obtained by a projection-reconstruction method. Therefore, if data obtained by the Fourier transformation in each radius direction (or projection in each direction) are subjected to a back-projection processing, a spin distribution image for this spectral component can be obtained. A spin distribution image of the other spectral component (for example, the spectrum of the nuclide of hydrogen in a certain kind of fatty substance) can also be obtained through similar data selection, Fourier transformation in each radius direction, and back projection.

DESCRIPTION OF THE PREFERRED EMBODIMENTS

First, an imaging method using a rotating field gradient will be briefly explained in conjunction with the two-dimensional imaging case.

In general, the phase of an NMR signal observed by applying a rotating field gradient $G_r(t) = G(i\cos \omega_G t + j\sin \omega_G t)$ describes the locus of a circle in a phase domain or so-called K-space (see Journal of Magnetic Resonance, 54, 338 (1983)). However, since such a circular signal is not symmetrical with respect to the center of the K-space, this signal cannot be utilized for the imaging as it is. Therefore, a proper preparation for the phase of the signal is required prior to the measurement of the signal.

Figure 1:
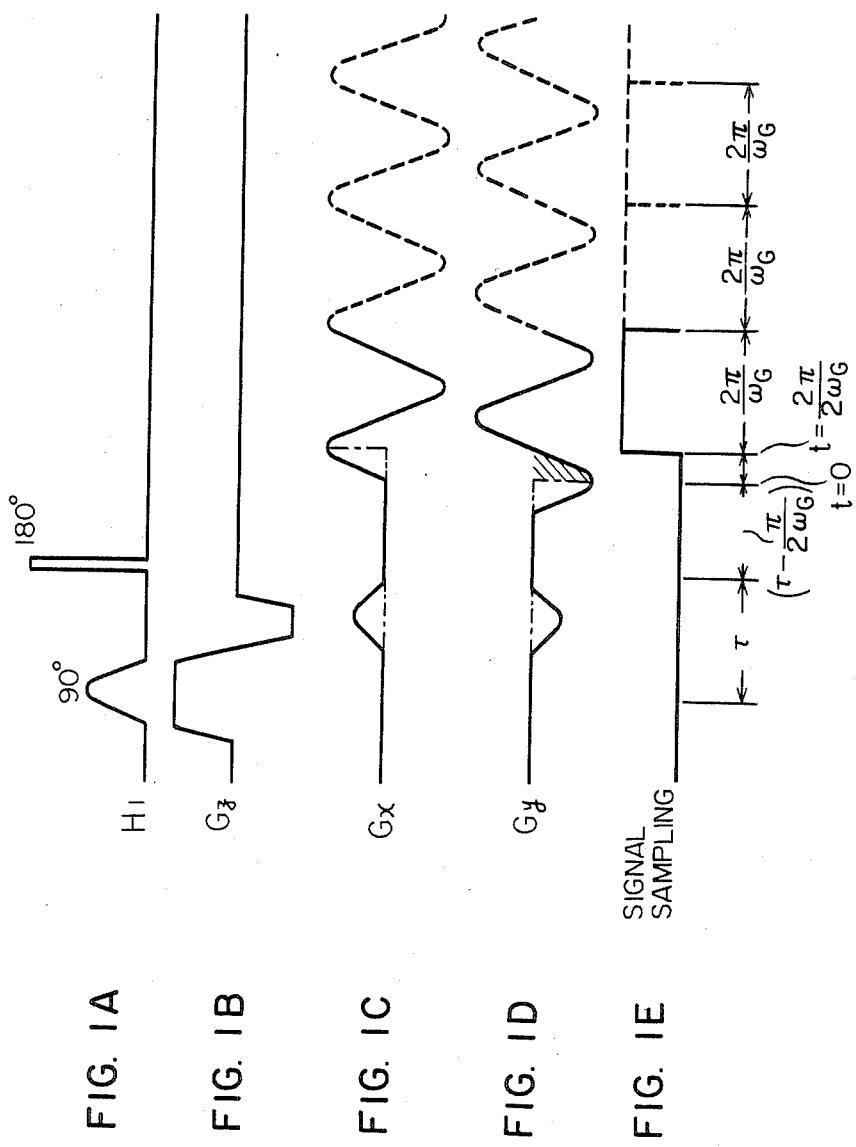
FIGS. 1A to 1E are views showing an example a pulse sequence for explaining a measurement sequence used in the present invention.

In the present invention, a pulse sequence as shown in FIGS. 1A to 1E as one example is used. First, a field gradient $G_z$ (see FIG. 1B) in the z-direction and a 90° RF pulse (see FIG. 1A) are simultaneously applied to an object placed in a static magnetic field $H_o$, thereby exciting nuclear spins in a specified slice of the object perpendicular to the z-direction. Next, a 180° RF pulse is applied to produce a spin echo at instant of time of t=0. Thereby, the preparation of a transversal magnetization signal of the object is completed. Thereafter, if a field gradient $G_y$ in the y-direction as hatched in FIG. 1D is applied, the NMR signal is translated in a direction of $-k_y$ in the K-space. It should be noted that to be exact, such an operation is true for the case where the field gradients $G_x$ and $G_y$ in the x- and y-directions have such changes as shown by one-dotted chain lines in FIGS. 1C and 1D. However, it is impossible to sharply raise up the field gradients $G_y$ and $G_x$ at t=0 and $t=\pi/2\omega_G$. Actually, therefore, field gradients $G$ and $G_y$ as shown by solid lines in FIGS. 1C and 1D are applied. An operation equivalent to the above-mentioned transversal magnetization signal preparation and signal translation is effected by the application of such field gradients as shown by solid lines. Next, field gradients $G_x$ and $G_y$ in the x- and y-directions represented by $$G_x = G\cos\left\{\omega_G\left(t - \frac{\pi}{2\omega_G}\right)\right\} \quad (1)$$

$$G_y = G\sin\left\{\omega_G\left(t - \frac{\pi}{2\omega_G}\right)\right\} \quad (2)$$

are applied starting from instant of time $t=\pi/2\omega_G$. The synthesis of these field gradients results in a field gradient which rotates with a period of $2\pi/\omega_G$ in the x-y plane. By sampling a spin signal from the object during the rotation of such a field gradient, phase information symmetrical with respect to the origin of the phase domain can be obtained directly from the measured signal.

In the present invention, the signal is sampled during a time when the rotation of the field gradient is continued plural times as shown by broken lines in FIGS. 1C and 1D.

For easy understanding of the present invention, description will now be made of a two-dimensional imaging by a circular spin mapping on which an idea of the present invention is based and which is disclosed in U.S. patent application Ser. No. 919,763 filed on Oct. 16, 1986 by some of the present inventors. If the measurement is carried out while changing the radius of a circle by successively changing the magnitude or strength G of the field gradient or the angular velocity $\omega_G$ of the rotation in the equations (1) and (2) concentrically circular phase information can be ultimately obtained which have the center thereof at the origin of the K-space. The total information thus obtained is identical to the total information obtained by the conventional projection-reconstruction method (see Nature, 242, 190 (1973)). Accordingly, if the obtained circular signal is subjected to a Fourier-transformation in the radius direction and thereafter to a back-projection processing, a spin distribution can be obtained.

In the case where a static magnetic field is homogeneous and no chemical shift is present, the above-mentioned circular signal can be expressed by $$S(t) = \int dx dy \rho(x,y) \exp\left[i\sqrt{x^2+y^2} \ \frac{\gamma G}{\omega_G} \cos(\omega_G t - \alpha_{xy})\right] \quad (3)$$

wherein $\rho(x, y)$ is the spin density, $\gamma$ is the gyromagnetic ratio and $\alpha_{xy}$ is defined by $$\alpha_{xy} = \tan^{-1}\left(\frac{y}{x}\right) + \frac{\pi}{2}.$$

Accordingly, the circular signal is a periodic signal having a period of $2\pi/\omega_G$. Therefore, it is possible to add signals obtained every period in a manner as shown in FIGS. 1C to 1E. This improves the S/N ratio.

In many cases, however, the inhomogeneity of the static field and the chemical shift cannot be neglected. In those cases, the mere addition of the signals obtained for the respective periods does not yield a significant result.

Returning to the explanation of the present invention, the present invention perceives the fact that a change or shift in signal phase appearing between the signals obtained for the respective periods is due to the inhomogeneity of the static magnetic field and the chemical shift, and the invention makes a reverse use of this fact.

Figure 2:
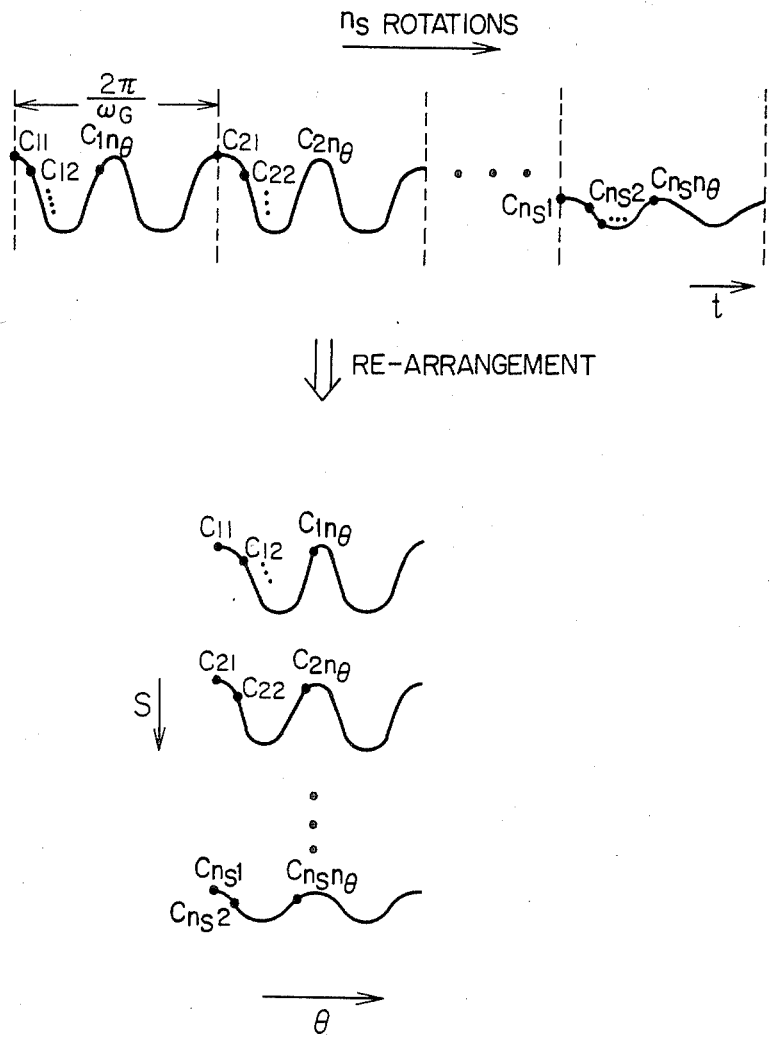
FIG. 2 is a view showing the re-arrangement of a signal obtained by one measurement.

Namely, if a signal obtained during the continuous rotation of the field gradient is sampled at a time interval of $2\pi/\omega_G$, a train of signals at the same point in a phase domain will be acquired. Since this signal train represents the dispersion of the phase of a spin signal of the object due to the chemical shift associated with the lapse or progression of time, the spectrum of the spin signal of the object can be derived from the signal train. Therefore, as shown in FIG. 2, if a signal obtained during the continuous rotation of the field gradient is sampled at a sufficiently short interval as compared with $2\pi/\omega_G$ and the resulting one-dimensional train of sample data is divided every one rotation of the field gradient and then re-arranged into a two-dimensional data train having an S-axis (or the direction of repetition of the rotation of the field gradient) and a $\theta$-axis (or the direction of lapse or progression of time during one rotation of the field gradient), spectrum information and position information can be obtained on the S- and $\theta$-axes, respectively. Further, by repeating such signal measurement and re-arrangement while successively changing the magnitude G of the field gradient, a substantially three-dimensional data train can be obtained. Such signal data is first Fourier-transformed in the spectrum axis (S-axis) direction and each spectral component is thereafter subjected to a Fourier transformation between a multiplicity of circular signals obtained by the change of G or in the radius direction in the K-space.

If the thus obtained separate projection data for respective spectral components are back-projected, a spectroscopic imaging can be effected. In this manner, a high speed spectroscopic imaging is possible without carrying out the continuous and sharp inversion of the field gradient.

In the method of the present invention, the maximum band of the spectrum axis is limited by $\omega_G/2\pi$. In the case where a spectral band is wider than $\omega_G/2\pi$, the spectral band can be expanded by N times by carrying out the measurement (N−1) times while making a successive delay of the sequence of the field gradients $G_x$ and $G_y$ and the sequence of the signal sampling with respect to the RF pulse by $\Delta t = 2\pi/(\omega_G N)$ per one measurement.

A circular signal obtained for a certain spectral component by the method of the present invention can also be expressed as follows:

$$S(t) = \int dx\,dy\, \rho(x,y) \sum_{n=0}^{\infty} \epsilon_n(i)^n J_n(R)\cos(n\omega_G t - n\alpha_{xy}) \quad (4)$$

wherein $J_n$ is the first kind of n-th order Bessel function, R is defined by $$R = \sqrt{x^2 + y^2}\; \gamma G/\omega_G,$$

and $\epsilon_n$ is the Neumann's coefficient which is 1 when n=0 and $\epsilon_n$=2 when n>0. The equation (4) shows that the circular signal is the superimposition of frequency components over an infinite frequency region. The frequency of each signal component is integer times as high as the frequency of rotation of the field gradient and the intensity thereof depends on the Bessel function and the spin density. Accordingly, the accurate detection of such a signal requires a receiver which has an infinite filtering band.

However, such impracticable requirement for the filtering band can be relieved by the nature of the Bessel function. Namely, the range of values of R is determined by the field of view, the magnitude of the field gradient and the frequency of rotation of the field gradient. Therefore, if the value of R is determined in a certain measurement, the highest order giving a contribution greater than 1/10000 in the equation (4) can be determined as $n \approx 1.1R+8.0$. Accordingly, by using a filtering band of $(1.1R+8.0)\omega_G/(2\pi)$, the generation of noises in the signal detection can be reduced with no loss of information. Since the magnitude G of the field gradient is changed every measurement, a filtering band adapted to the value of G should be used in each measurement. In the case of G=0, the filtering band may be $4\omega_G/\pi$.

A filtering which causes in the signal a phase shift depending on a frequency, cannot be used in the above-described measuring process. This is because the phase shift causes a shift of the projection angle. Therefore, it is effective to make the filter band of a receiver sufficiently wide and to subject a signal after the sampling thereof to a digital filtering which is symmetric with respect to time by a computer.

The construction and operation of an embodiment of the present invention will now be explained.

Figure 3:
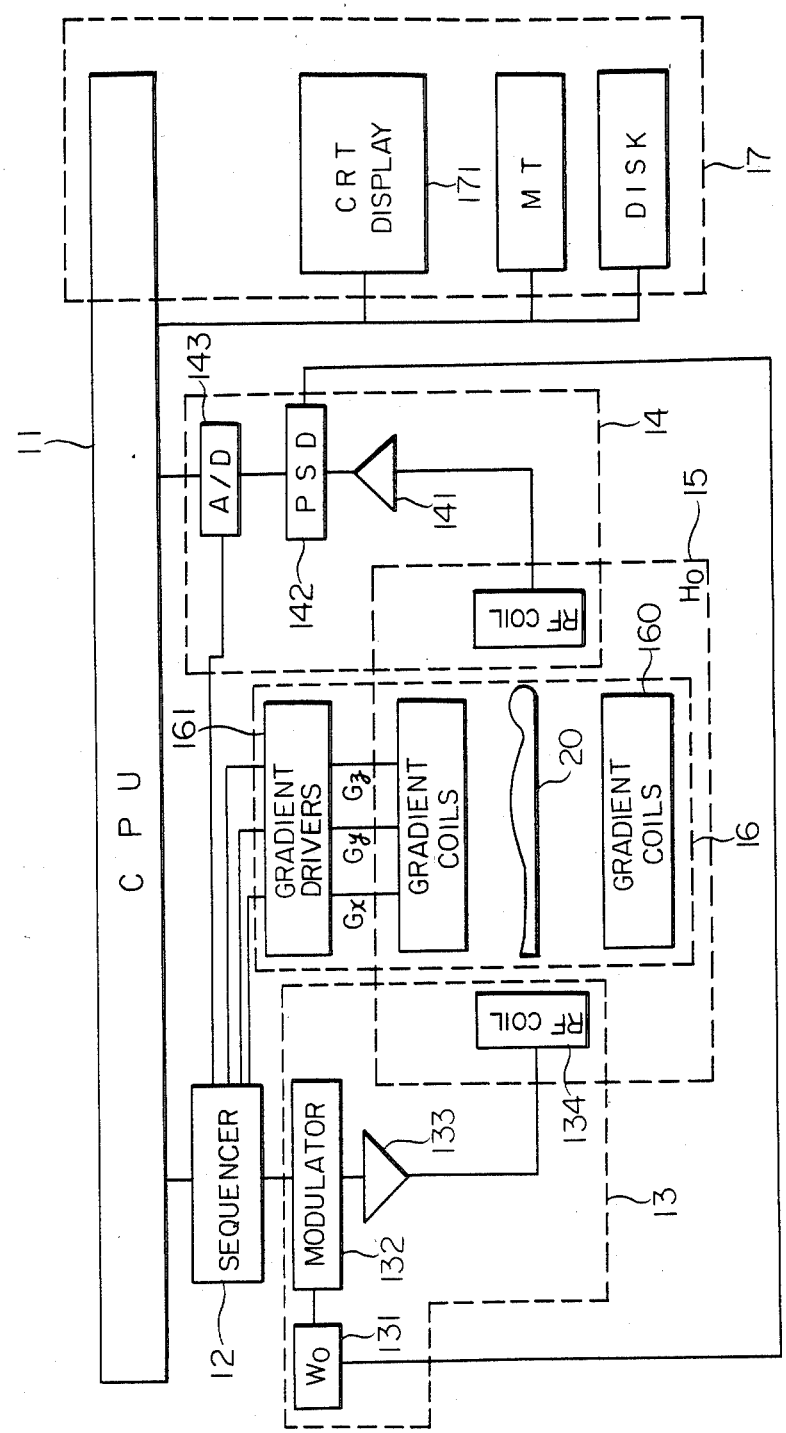
FIG. 3 shows a block diagram of an apparatus which realizes an embodiment of the present invention.
Figure 4:
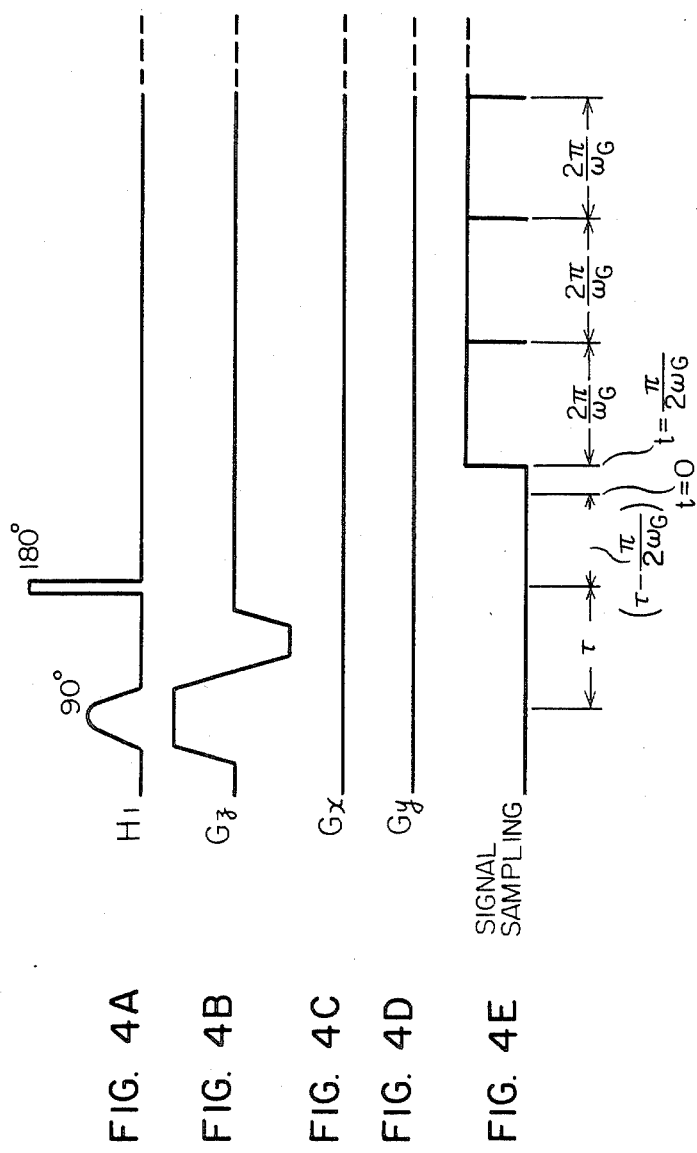
FIGS. 4A to 4E are views showing a part of a measurement sequence repeated in the embodiment.

FIG. 3 shows a block diagram of an apparatus which realizes a method according to the embodiment of the present invention. The apparatus comprises a sequencer 12 operating under the control by a CPU 11, a transmitter system 13, a receiver system 14, a field gradient generating system 16, a signal processing system 17 and a static magnetic field generating magnet 15. The sequencer 12 sends various instructions necessary for the method of the present invention to various components. The transmitter system 13 including an RF synthesizer 131, a modulator 132 and an RF amplifier 133 supplies to an RF coil 134 an RF pulse subjected to an amplitude modulation, etc. in accordance with an instruction from the sequencer 12 so that an RF magnetic field ($H_1$) is applied to an object 20 of interest. The field gradient generating system 16 including field gradient coils 160 wound in three directions of x, y and z and respective field gradient drivers 161 provided for those coils applies field gradients $G_x$, $G_y$ and $G_z$ in the x-, y- and z-directions to the object 20 in accordance with an instruction from the sequencer 12. A response to the application of these magnetic fields is received by the receiver system 14 through the RF coil 134. The receiver system 14 including an amplifier 141, a phase sensitive detector 142 and an A/D converter 143, derives data sampled at a timing according to an instruction from the sequencer 12 to the signal processing system 17. In the signal processing system 17, a processing inclusive of a Fourier transformation, an image reconstruction and a digital filtering is performed and a distribution of signal intensities or a distribution obtained through a proper operation on a plurality of signals is imaged or displayed on, for example, a CRT display 171.

Next, a spectroscopic imaging of a certain cross section of the object of interest according to the method of the present invention will be explained by virtue of FIGS. 1A to 1E. Though the application of field gradients shown by one-dotted chain lines in the figures is ideal, field gradients shown by solid lines are actually applied for making compensation for the fact that a time for switching the field gradient is a finite time. As has already mentioned, the application of the actually used field gradients shown by solid lines is equivalent to an ideal pulse sequence shown by one-dotted chain lines. Nuclear spins of the object are excited by the application of 90° and 180° RF pulses, which may be selective pulses, thereby preparing or providing for a spin transversal-magnetization signal at instant of time of t=0. Thereafter, a field gradient $G_y$ in the y-direction is applied for only a time of $\pi/(2\omega_G)$ (as shown by the hatched portion in FIG. 1D). After instant of time of $t=\pi/(2\omega_G)$, a field gradient $G_x$ in the x-direction is applied in addition to the field gradient $G_y$ in the y-direction. By changing $G_x$ and $G_y$ in cosine and sine forms, respectively, the direction of a synthetic field gradient $G_r = iG_x + jG_y$ is rotated with an angular velocity $\omega_G$. The sampling of a signal is carried out for a time from $t=\pi/(2\omega_G)$ to $t=\omega/(2\omega_G)+n_s 2\pi/\omega_G$ ($n_s$: an integer). The number of signal sampling within each rotation of 360° is $n_\theta$.

Such a measurement is repeated $n_r$ times while successively changing the magnitude or strength of the field gradient (i.e. G in the equations (1) and (2)) at an equal interval from 0 to $G_{max}$. But, in the case of G=0, since a change of the signal at the position of the origin of the K-space is measured, any translation and rotation in the K-space are not necessary. A sequence in that case is illustrated in FIGS. 4A to 4E.

With the above-mentioned repetition of measurement, a signal at the origin of the K-space and a multiplicity of concentrically circular signals having different radii are obtained.

Figure 5:
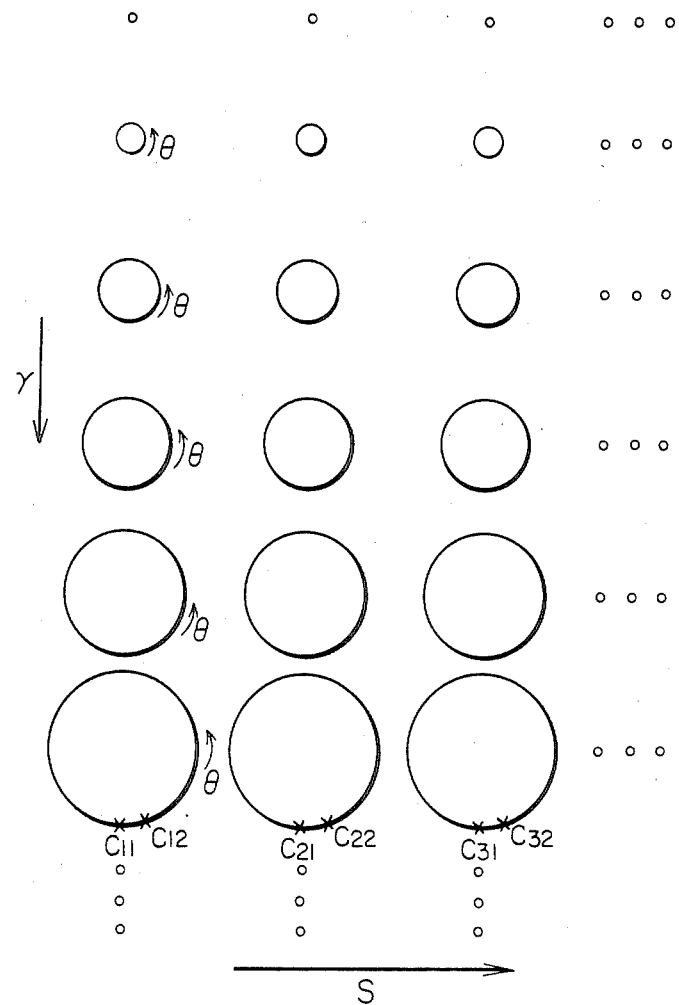
FIG. 5 is a general view of three-dimensional information obtained by n$_r$ measurements.

Next, the re-arrangement of data which has already been explained in conjunction with FIG. 2, is performed for each circular signal. Thereby, substantially three-dimensional data for S-, θ- and r-directions including a multiplicity of circles as shown in FIG. 5 are obtained. In FIG. 5, circles along the S-direction show positions of data successively obtained through plural rotations of the field gradient in the sequence shown in FIGS. 1A to 1E, and circles along the r-direction show positions of data successively obtained through the repetition of the sequence shown in FIGS. 1A to 1E while changing the magnitude G of the field gradient. At this point of time, such a digital filtering as mentioned above is performed for each circular signal with respect to the circumferential direction of the associated circle or the θ-direction. In that case, the filtering should be effectively made in such a manner that the filtering band $(1.1R+8.0)\omega_G/(2\pi)$ is changed in accordance with the radius of each circular signal.

Thereafter, a first Fourier transformation is performed with respect to the S-axis. Namely, each of data trains of data present at the same position in the K-space (for example, a train of data including $C_{11}, C_{21}, C_{31},$—or a train of data including $C_{12}, C_{22}, C_{32},$—, as shown in the lowest circles in FIG. 5) is subjected to the Fourier transformation in the S-axis direction. Next, each spectral component obtained by the first Fourier transformation is subjected to a second Fourier transformation with respect to the r-axis. At this point of time, data of projection of the object to various directions (θ) are obtained which are separate from each other for the respective spectral components. Finally, therefore, if a back-projection reconstruction processing is performed for each spectral component, separate spin density images for the respective spectral components can be obtained. Alternatively, separate localized spectra for respective picture element of the image can be obtained from the same data. A matrix of such data is determined by (number of points along spectrum axis)×(number of points along projection axis)×(number of projections)=$n_s \times n_r \times n_{74}$.

As has been described above, according to the present invention, a spectroscopic imaging method can be effected by expanding an NMR imaging method using a rotating field gradient. In the method of the present invention, substantially two-dimensional information including spectral information and spacial information can be obtained by a one-dimentional measurement without carrying out the sharp switching of a field gradient. As a result, a high speed NMR spectroscopic imaging having a wider range of applications as compared with the conventional NMR spectroscopic imaging can be realized.

We claim:

1. A high speed spectroscopic imaging method comprising:
    a first step of preparing a transversal magnetization signal of an object placed in a homogeneous static magnetic field;
    a second step of applying a field gradient in a specified direction in a specified plane of said object to translate a position of the signal in a phase domain from the origin of a K-space;
    a third step of sampling the signal while rotating a position of the signal in the K-space plural times on a given circle with the center thereof at the origin of the K-space by applying a field gradient with its direction continuously rotating in said specified plane; and
    a fourth step of performing respective Fourier transformations for plural data trains each of which is composed of data present at the same position on the K-space in a group of data obtained at said third step, thereby effecting a spectral analysis of the signal.

2. A high speed spectroscopic imaging method according to claim 1, further comprising a fifth step of re-arranging a one-dimentional train of data obtained by the sampling at said third step into a two-dimensional train of data arranged along two axes including an S-axis in the direction of repetition of rotation of said field gradient and a θ-axis in the direction of progression of time during one rotation of said field gradient, the re-arranged data being subjected to the Fourier transformation at said fourth step.

3. A high speed spectroscopic imaging method comprising:
    a first step of preparing a transversal magnetization signal of an object placed in a homogeneous static magnetic field;
    a second step of applying a field gradient in a specified direction in a specified plane of said object to translate a position of the signal in a phase domain from the origin of a K-space;
    a third step of sampling the signal while rotating a position of the signal in the K-space plural times on a given circle with the center thereof at the origin of the K-space by applying a field gradient with its direction continuously rotating in said specified plane;
    a fourth step of repeating said first to third steps plural times while changing the magnitude of said field gradient, thereby to obtain a plurality of groups of signal data which are respectively arranged on a multiplicity of concentric circles with different radii on the K-space;
    a fifth step of performing respective Fourier transformations for plural data trains each of which is composed of data present at the same position on the K-space in said data groups, thereby effecting a spectral analysis of the signal;
    a sixth step of subjecting spectral components of a spectrum obtained at said fifth step to respective Fourier transformations with respect to the direction of repetition of the measurement at said fourth step, thereby obtaining projections to a plurality of directions; and
    a seventh step of back-projecting the projections to the plurality of directions obtained at said sixth step, thereby obtaining spin distribution images.

4. A high speed spectroscopic imaging method according to claim 3, wherein said fourth step includes a phase of sampling the signa for a predetermined time after the preparation of the transversal magnetization signal without applying the field gradient, thereby to obtain a data group indicative of signal data at the origin of the K-space.

5. A high speed spectroscopic imaging method according to claim 3, further comprising an eighth step of re-arranging the plurality of data groups obtained at said fourth step into a three-dimensional data train arranged along three axes including an S-axis in the direction of repetition of rotation of said field gradient, a θ-axis in the direction of progression of time during one rotation of said field gradient and an r-axis in the direction of repetition of said first to third step at said fourth step, the Fourier transformations at said fifth and sixth steps being performed with respect to the S- and r-axes, respectively.

6. A high speed spectroscopic imaging method according to claim 5, further comprising a ninth step of subjecting, each of plural data groups obtained by the data re-arrangement at said eighth step and arranged on the respective circles, to a signal filtering which does not cause any phase shift due to a frequency, said fifth and sixth steps being made for data after the filtering.

7. A high speed spectroscopic imaging method according to claim 6, wherein the filtering at said ninth step is a digital filtering which is symmetrical with respect to time.

8. A high speed spectroscopic imaging method according to claim 6, wherein a pass band of the filtering at said ninth step is determined by the frequency of rotation of said field gradient, the magnitude of said field gradient and the field of view of an image.

* * * * *